(12) United States Patent
Hankla

(10) Patent No.: US 10,326,037 B1
(45) Date of Patent: Jun. 18, 2019

(54) PHOTONIC ENERGY STORAGE DEVICE

(71) Applicant: Quantum Photonics Corporation, Tyler, TX (US)

(72) Inventor: Matthew Ryan Hankla, Tyler, TX (US)

(73) Assignee: Quantum Photonics Corporation, Tyler, TX (US)

( * ) Notice: Subject to any disclaimer, the term of this patent is extended or adjusted under 35 U.S.C. 154(b) by 0 days.

(21) Appl. No.: 16/112,980

(22) Filed: Aug. 27, 2018

(51) Int. Cl.
| | |
|---|---|
| H01L 31/055 | (2014.01) |
| H01L 31/12 | (2006.01) |
| H01L 31/054 | (2014.01) |
| H01L 31/02 | (2006.01) |
| H01L 31/0687 | (2012.01) |
| H01L 31/048 | (2014.01) |
| H01L 31/053 | (2014.01) |
| H01L 31/0304 | (2006.01) |
| H01L 31/052 | (2014.01) |
| H01S 3/16 | (2006.01) |

(52) U.S. Cl.
CPC ........ H01L 31/12 (2013.01); H01L 31/02008 (2013.01); H01L 31/0304 (2013.01); H01L 31/048 (2013.01); H01L 31/053 (2014.12); H01L 31/0521 (2013.01); H01L 31/0547 (2014.12); H01L 31/0687 (2013.01); H01S 3/1643 (2013.01); H01S 3/1691 (2013.01); H01S 3/1698 (2013.01)

(58) Field of Classification Search
CPC ... H01L 31/12; H01L 31/053; H01L 31/0547; H01L 31/02008; H01L 31/0304; H01L 31/048; H01L 31/0521; H01L 31/0687

USPC .......................................................... 136/246
See application file for complete search history.

(56) References Cited

U.S. PATENT DOCUMENTS

2009/0272424 A1* 11/2009 Ortabasi ............. H01L 31/0543
136/246

FOREIGN PATENT DOCUMENTS

CN       202581087 U      12/2012

OTHER PUBLICATIONS

Lisa Zyga, "LED's efficiency exceeds 100%," phys.org, 2012, visited Jun. 26, 2018; 2 pgs. https://phys.org/news/2012-03-efficiency.html.

(Continued)

*Primary Examiner* — Jayne L Mershon
(74) *Attorney, Agent, or Firm* — Maier & Maier, PLLC

(57) ABSTRACT

An energy storage capsule for storing energy in the form of photons. The body of the capsule may surround a sealed vacuum environment in which several layers of reactive material are contained, including an inner reflective coating, a first photovoltaic cell, an optical amplification medium, a second photovoltaic cell, and an outer reflective coating, provided in that order. The body of the capsule may also be reflective, for example polished aluminum. Light may be emitted from an LED wafer which may be integrated with the surface of the optical amplification medium, directed at the several layers of reactive material. Some photons may be reflected by the reflective material, storing them within the capsule, while others may be absorbed by the photovoltaic cells, powering the LEDs to transmit more photons. The thermal environment of the energy storage capsule may be maintained such that the LEDs can operate at over 100% efficiency.

20 Claims, 9 Drawing Sheets

(56) References Cited

OTHER PUBLICATIONS

Bill Schweber, "Efficiency Greater Than 100%? Yes, Sort of," EE Times, 2015, visited Jun. 26, 2018; 2 pgs. https://www.eetimes.com/author.asp?section_id=36&doc_id=1325379.

Dodd J. Gray et al., "Design for enhanced thermo-electric pumping in light emitting diodes," Applied Physics Letters 103, 2013, p. 123503-1 to 123503-5, visited Jun. 26, 2018; 6 pgs. http://www.rle.mit.edu/sclaser/documents/GrayDesign.pdf.

American Institute of Physics, "Photodielectric discovery brings new optical control to electronics," phys.org, 2017, visited Jun. 26, 2018; 3 pgs. https://phys.org/news/2017-04-photodielectric-discovery-optical-electronics.html.

"Author Topic: A concept: Overunity with an led using its light to self-recharge battery . . . ?" Over Unity Research 2011, visited Jun. 26, 2018; 20 pgs. https://www.overunityresearch.com/index.php?topic=1002.0.

\* cited by examiner

PHOTONIC ENERGY STORAGE DEVICE

BACKGROUND

Cavity resonators are hollow closed conductors, such as metal boxes or cavities provided within metal enclosures, which may contain electromagnetic waves reflecting back and forth between the cavity's walls. For devices referred to by the term "cavity resonators," these waves are most often radio waves or microwaves. When a source of radio waves or microwaves (or, in some instances, other forms of electromagnetic energy) that is at one of the cavity's resonant frequencies is applied, the oppositely-moving waves form standing waves, and the cavity stores electromagnetic energy. Microwaves are often most practical for this purpose, because the cavity's lowest resonant frequency is the frequency at which the width of the cavity is equal to a half-wavelength, meaning that cavities that make use of longer-wavelength radio waves can often be oversized.

Cavity resonators also exist for other parts of the electromagnetic spectrum. Optical resonators, also called optical cavities or resonating cavities, are arrangements of highly reflective mirrors or reflective material that form standing-wave cavity resonators for light waves, such as IR waves, visible light waves, or UV waves. Optical resonators are a major component of lasers, and may be disposed around the lasing medium in order to provide feedback for the laser light. Light that is confined in a resonator will reflect multiple times from the mirrors in a manner that tends to form stable patterns or frequencies. (Only certain patterns or frequencies will typically be produced, with others being suppressed by destructive interference.)

The efficiency of a laser, or other resonator-based system, is described by the gain coefficient, which specifically describes the ability of a laser medium to increase optical power. Certain losses may be associated with elements of the resonator system which can reduce the gain of the laser or otherwise impair efficiency. Specifically, losses may be associated with transmission of light at the resonator mirrors, absorption and scattering by the mirrors, absorption by the laser medium, and diffraction losses at the mirrors. Each of these losses may contribute, in some manner, to reduction of the overall gain coefficient.

An important concept is the "round trip gain" of the resonator, which may determine whether the output power of the laser or other resonator device may increase, decrease, or remain constant, based on losses or amplifications that the light beam may have in a complete round trip through the laser. (When the round trip gain G is greater than 1, the oscillations in the resonator will grow, while when the round trip gain G is less than 1, the oscillations in the resonator will die out.) As the laser light completes this loop, from a mirror on one side of the resonator to a mirror on the other side of the resonator and back again, some of the light may be transmitted through each mirror and may exit the cavity. (In lasers, this transmitted light may form the beam.) Round trip gain may be a ratio of the intensity of radiation at the end of the loop to the intensity of radiation at the beginning of the loop. This value may be determined by the volume losses in the laser or other resonator, and by the losses in the form of useful output supplied through the mirrors.

Specifically, round trip gain G may be provided as:

$$G = \frac{\text{Final irradiance}}{\text{Initial irradiance}} = \frac{I_0 * R_1 * e^{(k-\gamma)L} * R_2 * e^{(k-\gamma)L}}{I_0} = \frac{I_0 R_1 R_2 e^{2(k-\gamma)L}}{I_0}$$

with $I_0$ representing the initial irradiance value, $R_1$ representing the reflectivity of the first reflector, $R_2$ representing the reflectivity of the second reflector, and $e^{(k-\gamma)L}$ representing the change in the beam irradiance each time the beam passes through the lasing medium. $\gamma$ may represent the effective volume loss coefficient, while k, or $k_{th}$, may be the threshold gain coefficient, given as a function of the length of the lasing medium L, $R_1$ and $R_2$, and $\gamma$. (Specifically, $$k_{th} = \gamma + \frac{1}{2L}\ln\frac{1}{R_1 R_2}.)$$

SUMMARY

While cavity resonators have been used for storage of electromagnetic energy, the relatively high losses associated with optical resonators and optical resonator-like devices have largely prevented them from being employed for similar purposes. Some of the terms described above, such as the reflectances or the effective volume loss component $\gamma$, can often represent a highly significant leakage of electromagnetic energy; for example, an effective volume loss component $\gamma$ of 10% can mean that the beam in the resonator experiences 10% losses per round trip. The present application sets forth various exemplary embodiments of a photonic energy storage device which may improve on past optical resonator designs to the point where it may be practical for energy storage or even, under some circumstances, energy generation.

According to an exemplary embodiment, a photonic energy storage device may be provided as a capsulized suspended vacuum environment made from a reflective material, which may contain an array of photoelectric cells, as well as an array of photonic energy sources. These photonic energy sources may be, for example, 790-910 nanometer infrared light emitting diodes (LEDs), or any other LEDs or other sources, such as may be desired. In an exemplary embodiment, the photoelectric cells used in the design may have a quantum efficiency at a particular wavelength band, such as 97% efficiency at 694.3 nm-700 nm, allowing for highly efficient electrical power generation when absorbing light in this wavelength band. In other exemplary embodiments, different materials or different combinations of materials may be used as the reflective material, as photoelectric cells, or as photonic energy sources, such as may be desired.

According to an exemplary embodiment, the capsulized environment may be constructed from a polished material that may be specifically shaped and atomically structured in order to provide for the most efficient reflectivity in a particular wavelength or over a particular wavelength band. For example, in one exemplary embodiment, the capsulized environment may be constructed from polished aluminum.

According to an exemplary embodiment, the photoelectric cells provided in the capsulized environment may be manufactured with multi-junction layers, which may contain crystalline structures that are most reactive to the specific wavelength of photonic energy that is supplied by the light-emitting diode, for example the 694.3 nm-700 nm wavelength band or another wavelength band, such as may be desired. For example, in one exemplary embodiment, the photoelectric cells provided in the capsulized environment may be thin layer multi-junction gallium arsenide solar cells.

According to an exemplary embodiment, the capsulized environment, with photoelectric cells and photodiodes included, may be suspended in a vacuum environment. The photodiodes may be provided with circuitry configured to adjust the emitter output to the most efficient levels, given the conditions in the capsulized environment and outside of the capsulized environment, in order to maximize outputs. The entire enclosure, including the capsulized environment and the vacuum suspension enclosure, may be stored in a cooling system, which may be equipped with sensors in order to monitor a temperature state of the enclosure and maximize cooling efficiency based on the measured filtered inputs and outputs of the enclosure.

According to an exemplary embodiment, such a system may be used to provide continuous power output over an extended period of time, and may operate silently while having high reusability. In certain embodiments, low-cost materials and/or reusable materials may be incorporated into the design in order to minimize production costs or in order to allow for recycling of components. The overall power supply may be very durable, as compared to other reusable power source solutions such as lithium-ion polymer batteries (LiPo batteries) and can operate effectively as energy storage in certain extreme applications such as in unmanned aerial vehicles (UAVs).

Such a system may also be used to provide some level of power storage over a very long period of time without replacement. In one major advantage, the life expectancy of each of the parts may be far beyond the typical life expectancy of batteries with similar operating characteristics, such that the average life expectancy of a photonic energy storage device may be an estimated 20 to 30 years. This may allow for the photonic energy storage device to be used in a variety of applications where it is desired to have a system operate for an extended period of time without maintenance but where the system may have ready access to a power source in order to recharge stored energy, or where the system may be installed in an area having a favorable temperature gradient that allows the LEDs to provide power generation through the temperature gradient alone. (For example, in some exemplary embodiments, the system could be deployed on a satellite, in a communications drone such as the GOOGLE SKYBENDER or any other drone intended to loiter in the air for an extended period of time, in a deep-sea application like a marker buoy, or in various other applications such as may be envisioned.)

Looking at an exemplary embodiment of a photonic energy storage device, a photonic energy storage device may be focused around a photonic energy storage capsule. This capsule may include a capsule body, which may surround a sealed vacuum environment and may have an internal wall including a set of at least five thin layers of reactive material on all or part of the internal portion of the capsule body. (In an exemplary embodiment, these thin layers may be disposed within the capsule so that all of the layers are arranged lengthwise, perpendicular to the length of the capsule, or in any other arrangement such as may be desired.) These five layers may include at least an inner reflective coating provided on an innermost part of the wall, then a first photovoltaic layer, then an optical amplification layer, then a second photovoltaic layer, then an outer reflective coating. (In some exemplary embodiments, this pattern may repeat all the way to the other side of the innermost part of the wall.) The capsule may also have at least one LED wafer which may be integrated with the optical amplification layer and may be used in order to provide photons in the photonic energy storage capsule internal environment, which may largely be reflected but may also be absorbed by the photovoltaic layers, allowing for power to be siphoned from the capsule or used to generate more photons from the integrated LED wafer. This may be performed using an external control board, which may be placed within an enclosure placed around the capsule, and may be connected to each of the electrical components.

In an exemplary embodiment, each of the thin layers of reactive material may have a thickness of 80 microns or less, or may have an average thickness of 80 microns or less. The capsule body may be formed, in whole or in part, from polished aluminum; the optical amplification medium may be ruby, emerald, or neodymium-doped yttrium aluminum garnet (or any other material such as would be desired), the LEDs may emit photons having a wavelength emission peak within the range of 694.3 nm to 700 nm, and the photovoltaic layer may have a high efficiency in that range (and may be, for example, at least one layer of multi-junction gallium arsenide photovoltaic cells). Other variants may also be possible in other exemplary embodiments.

In an exemplary embodiment, an enclosure may be placed around the capsule in order to protect it from the external environment or house components external to the capsule such as the control board. In an exemplary embodiment, the enclosure may include a cooling system, such as a cooling fan, which may facilitate cooling of the capsule. In certain exemplary embodiments, the enclosure may be square, rectangular, circular, polygonal, or any other shape such as may be desired, and may have one or more openings or open portions such as a slot for the aforementioned cooling system. In some exemplary embodiments, the enclosure, and the capsule, may be formed from multiple pieces, such as two halves of an enclosure that meet at the halfway point. (In some exemplary embodiments, the two halves of the enclosure and the two halves of the capsule may not be aligned; for example, the parting line of the capsule may be disposed at an angle from the parting line of the enclosure. Alternatively, the capsule may be inserted into and secured in the enclosure in some other manner other than by assembling and securing the two at a parting line, such as by removing the end of the enclosure that is opposite the fan and inserting the capsule as a single piece.)

This device may generally be used in the following way. After activation of the device, the device may be provided with any necessary power, such as by a power source or by one or more supercapacitors that may be electrically connected with the device. It may then emit photons into the internal environment of the capsule, which may be gradually harvested as they pass through the reflective material. Electrical power produced by the absorption of the photons by the photovoltaic layers may either be siphoned off or used to generate additional photons.

The flow of electrons within the system may create heat within the capsule. This heat may be dealt with in one or more of several different ways. First, in some exemplary embodiments, the vacuum inside the capsule may be slightly compromised or may exist at a low level of vacuum (which may, for example, be a "low vacuum," somewhere in the range of 760 to 25 torr, or may be a higher level of vacuum that is still imperfect). A small number of particles may remain in the vacuum environment, which may allow some level of convection to occur within the capsule, allowing heat to be conducted away from the surfaces of the capsule (for example, from an area between the layers disposed in the capsule). Second, because the components disposed within the capsule may be coupled to the walls of the capsule, some level of conduction may occur over the coupling sites, allowing heat to be conducted through the capsule and into the outer wall, where it may be removed by the cooling system as desired. Third, some level of heat may also be transmitted via radiation, so that it reaches the outer surface of the capsule.

Once heat reaches the outer surface of the capsule, it may be removed by the cooling system that is configured to cool the capsule. In an exemplary embodiment, the capsule may exist within an enclosure and air may be conducted through this enclosure from one side of the enclosure to the other, over as much of the capsule surface as possible, in order to remove heat from the enclosure and maintain the system at a steady-state temperature during normal operation. This cooling effect may help reverse the effects of the heat transfer process from inside the capsule to outside the capsule, and may assist in maintaining ideal vacuum conditions within the capsule. (In an exemplary embodiment, the outer surface of the capsule may be provided with one or more heatsinks, over which the cooling system may blow air or which the cooling system may otherwise blow.)

In an exemplary embodiment, a fan provided in the outer wall of the enclosure may be a simple fan, similar to a CPU cooling fan or other analogous device which may typically be used to cool electrical components. In another exemplary embodiment, the fan may be integrated with the outer wall of the enclosure so as to have one or more performance enhancing structures based on the geometry of the enclosure. For example, in an exemplary embodiment, pieces may be fixed on either side of the fan, relative to the length of the enclosure, which may be used to induce air resistance in the input air. This may ensure that the air pressure within the enclosure is higher, as the fan structure may be configured to leverage calculated resistance to the air input and resistance to the air output to increase airflow, while also helping to filter the input air. (The overall effect may be to create a sort of "capacitance" in the air conducted through the enclosure.) This may allow a lower-powered fan to be integrated with the enclosure (improving the performance of the device, as power for the fan may be drawn from the device such as may be desired) by allowing the lower-powered fan to be used to produce a fast air current capable of conducting a significant quantity of heat away from the device.

In some exemplary embodiments, it may be desirable to provide the LED wafers or other light sources that may be used in the design with thermal cooling materials integrated with the wafers or other sources. For example, according to an exemplary embodiment, the wafers may be fitted with PCB materials, copper, aluminum, thermo-electric coolers (TECs), or other cooling components, which may exit the capsule without disrupting the vacuum environment. In various exemplary embodiments, the fan or other cooling system may cool the portions of these cooling components that exit the capsule to atmospheric temperature or to a temperature below atmospheric temperature, in a manner that focuses the cooling effect of the system on these individual components and does not disrupt the optimum operating temperature of the other components involved in the system.

Various alternative implementations of the system, other than in a capsule design provided in an enclosure such as is shown in several of the figures, may be disclosed. For example, according to an exemplary embodiment, it may be desired to implement the system as a "power sheet" for a cellular phone or other portable device, capable of retaining some level of power while having a very low profile. This may allow for extremely thin devices that may retain some level of power when removed from a charging dock, in a manner that allows them to display some level of image or video content. Some example implementations include smart ID badges or smart tickets (which may operate in a low-power state most of the time and may only be briefly activated), communications devices, gaming devices, and any other low-profile electronic devices such as may be desired. Such a design may also be used to provide a display screen on a thin component such as a door or lid, which may be occasionally opened (breaking a charging circuit) but which will remain closed (leaving a charging circuit in place) most of the time. Other implementations may also be contemplated for a "power sheet" that may be provided along with another power source such as an electrical plug or a battery; for example, in an exemplary embodiment, a "power sheet" may be provided in immediate connection with a display in order to ensure that power is immediately available to the entire screen of a display, which may have advantages for increasing display response time. For example, in one exemplary embodiment, a cell phone may have various "power sheets" or "power layers" which may be provided along with a battery and/or a supercapacitor, with these "power sheets" being provided on the back of the cell phone body and routed to the internal battery or supercapacitor inside the phone. (In various embodiments, such sheets may be used in a variety of basic low-powered electronics, from small "smart devices" up to televisions.)

An exemplary embodiment of a system may also be used to provide power to another device, such as a device that draws a significant amount of power such as an electric car. It may be noted that one of the major obstacles to the use of electric cars has been the gradual degradation of the electric car battery, leading to "capacity fade" over time. While many batteries currently in use can limit this to some extent (for example, the TESLA MODEL S reportedly has around 5% battery degradation over its first 50,000 or so miles) alternative solutions may still exist, particularly if it is desired to reuse batteries even after they are removed from the electric vehicle. (For example, it may be contemplated that charging stations may exist whereby a depleted battery may be swapped for a charged battery in order to allow electric vehicles to complete long road trips. In these cases, batteries may be rapidly swapped and depleted, and significant battery degradation may be noted.) As such, an exemplary embodiment of a photonic energy storage system may be used in order to reduce the effective battery degradation caused by the vehicle.

For example, according to an exemplary embodiment, a photonic energy storage system for a vehicle or other large power consumer may have a clear cylindrical vacuum chamber with a number of layered cores corresponding to the layers provided in the capsule design or in other exemplary embodiments. (In some exemplary embodiments, layers may be of any thickness, such that hundreds or even thousands of layers may be contemplated to be present. For example, in an exemplary embodiment, a reflective coating may be atomically structured in order to reflect most of the utilized monochromatic light of the pump sources over the applicable bandgap, which may reflect light into a slightly thicker high-absorption-efficiency photovoltaic cell. A lasing medium may also be provided, which may in some exemplary embodiments have an LED wafer integrated into the lasing medium layers, such that the wafer can flash at a frequency in order of a particular algorithmic sequence that may be predetermined to assist in maintaining thermal equilibrium and utilizing the lasing medium's luminescence properties. This lasing medium may be, for example, any medium such as ruby or any crystalline structure capable of solid state optical amplification and capable of inducing stimulated emission, and may be provided in thin layers that may have a thickness similar to that of the high-absorption-efficiency photovoltaic cell layers.) In the center of the layered cores may be provided a hole, which may function as a storage location for a supercapacitor. This supercapacitor may be used for routing the harvested energy from the layers for storage, such as may be desired. (Various other uses may be contemplated for such a system, other than as a quickly and easily replaceable component of an electric car. For example, it may be used in any other vehicle, such as a vehicle used in a shop or production environment like a forklift, that may be in close connection with charging stations but may rapidly undergo battery cycling in normal use.)

BRIEF DESCRIPTION OF THE FIGURES

Advantages of embodiments of the present invention will be apparent from the following detailed description of the exemplary embodiments thereof, which description should be considered in conjunction with the accompanying drawings in which like numerals indicate like elements, in which.

DETAILED DESCRIPTION

Figure 1:
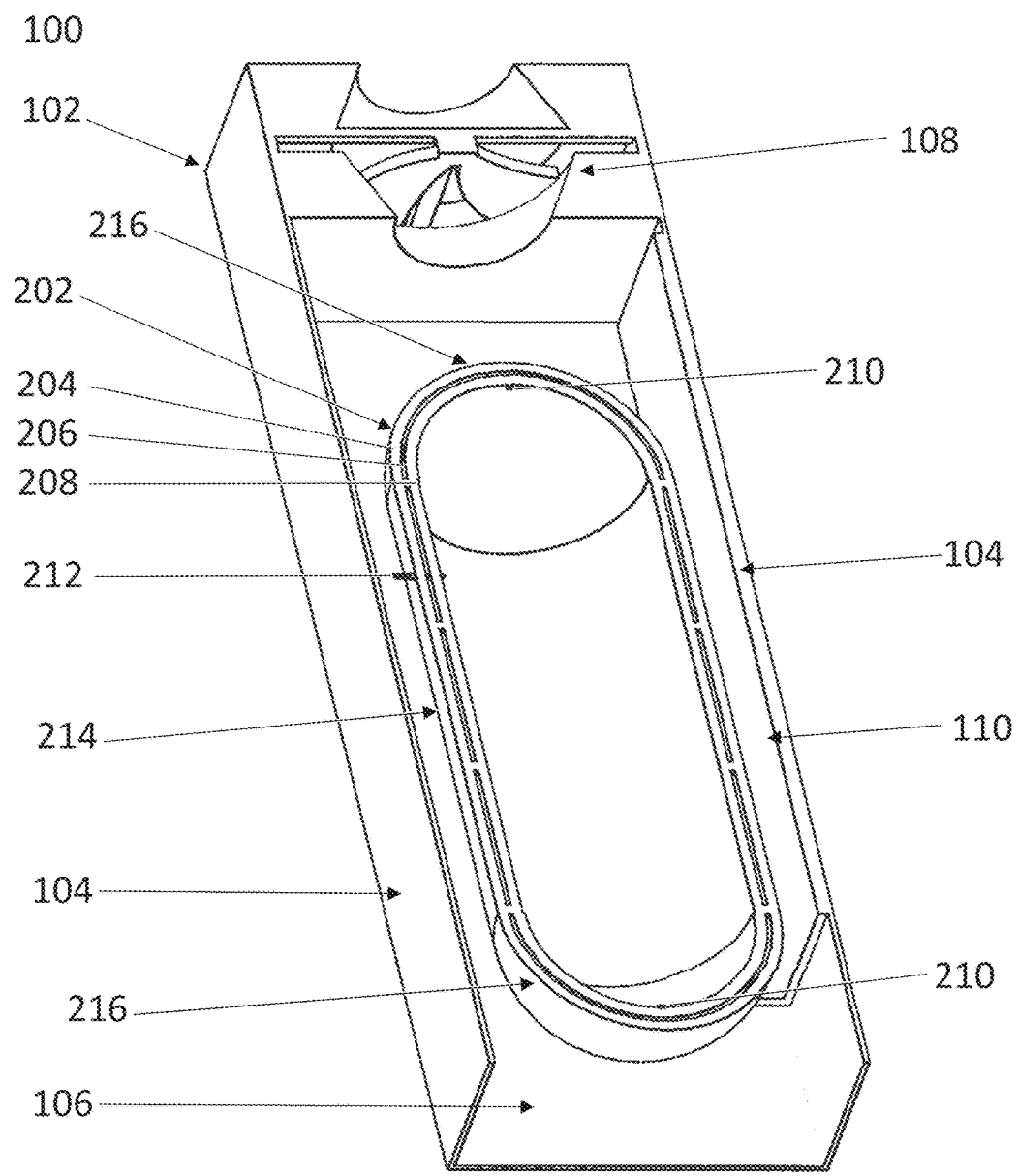
FIG. 1 is an exemplary embodiment of a photonic energy storage device half.

Aspects of the invention are disclosed in the following description and related drawings directed to specific embodiments of the invention. Alternate embodiments may be devised without departing from the spirit or the scope of the invention. Additionally, well-known elements of exemplary embodiments of the invention will not be described in detail or will be omitted so as not to obscure the relevant details of the invention. Further, to facilitate an understanding of the description discussion of several terms used herein follows.

As used herein, the word "exemplary" means "serving as an example, instance or illustration." The embodiments described herein are not limiting, but rather are exemplary only. It should be understood that the described embodiments are not necessarily to be construed as preferred or advantageous over other embodiments. Moreover, the terms "embodiments of the invention", "embodiments" or "invention" do not require that all embodiments of the invention include the discussed feature, advantage or mode of operation.

Further, as provided herein, certain features in the drawings may be illustrated in sizes that are conducive to allowing their depiction. For example, in many exemplary embodiments, features such as a reflective layer or reflective coating of a photovoltaic storage device may be extremely thin or even atomically thin. However, in many cases, these features have been illustrated, in the Figures, as being substantially thicker than they may be contemplated to be in practice, so that their arrangement can be clearly understood from the Figures. It is noted that, to the extent such features (like the reflective layer) are depicted in overly large sizes in the Figures, these elements of the Figures are not to scale. (Likewise, in many embodiments, more layers may be present than are depicted in the Figures.)

According to an exemplary embodiment, and referring generally to the Figures, various exemplary implementations of a photonic energy storage device may be disclosed. According to an exemplary embodiment, a photonic energy storage device may function by utilizing efficiencies not generally associated with solar or photovoltaic cells by making each layer of the internal crystalline structure of the photonic energy storage device capsule be specific to the single range of light waves that are produced by the emitters. Likewise, it may be contemplated that, in some exemplary embodiments, efficiency may be improved by including similarly-reactive lattice structures in a single component, in order to ensure that all or almost all photons that are directed towards the photovoltaic cell are captured. The photonic energy storage device environment may be arranged to have these lattice structures arranged on opposite portions of the capsule, on at least the front and back end, so that light is reflected from the rest of the capsule onto the lattice structures.

In an exemplary embodiment, each of the photovoltaic cells may be backed by a reflective surface, which may allow for recycling of photons in the solar cells that would otherwise be lost. (It may, for example, be contemplated that, even when a number of photovoltaic cells are used in the lattice structures, some photons may still pass through all of the photovoltaic cells in the lattice structures without being absorbed into any one of the photovoltaic cells. The reflective surface provided as a backing portion to the photovoltaic cells may ensure that most of the photons that would otherwise be lost may be redirected back into the photovoltaic cell lattice structure by the reflective material, and (if still not absorbed) are redirected back into the capsule, at which point there may be another opportunity for them to be absorbed by another photovoltaic structure in another part of the capsule.

In an exemplary embodiment, the photovoltaic cells may be provided, together with the reflective material, in a layered design also including an optical amplifier. Specifically, according to an exemplary embodiment, the design may include a first layer of reflective material, a first photovoltaic layer, an optical amplification medium, a second photovoltaic layer, and a second layer of reflective material. In an exemplary embodiment, each of these layers may be approximately 80 microns in thickness, though each layer may be thicker or thinner if desired. (Individual layers or individual types of layers may each vary. For example, in some exemplary embodiments, it may be desired to have a first photovoltaic layer that is thicker than the second photovoltaic layer, or vice-versa, if desired.) In an exemplary embodiment, an optical amplification medium may be, for example, ruby, or another optical amplification medium capable of inducing stimulated emission. (Other optical amplification mediums may include, for example, emerald, neodymium-doped yttrium aluminum garnet (Nd: Y3A15O12 or "NdYAG"), or any other such optical amplification media such as may be desired.) In an exemplary embodiment, the use of a central optical amplification layer may be used to provide an environment conducive to stimulated emission, such that light reaching the optical amplification layer may propagate through the optical amplification layer, and such that, because of the medium's light-radiating and luminescence properties, the light may be evenly distributed from the pump source (such as LEDs or some other light source such as may be desired) across the surface area of the second set of photovoltaic cells. This may ensure that light is properly directed into the photovoltaic cells and that the intensity is approximately uniform across the second layer of photovoltaic cells, and may also ensure that light that is reflected off of the second reflective layer and past the second layer of photovoltaic cells to the first layer of photovoltaic cells is likewise evenly distributed. This may also create a cascading effect of amplification through secondary emission and stimulated emission.

In an exemplary embodiment, the capsule of the photonic energy storage device may be provided in a vacuum environment, which may be provided in and around the reflective material. This may isolate the components of the capsule from the conduction and convection of heat, ensuring a more generally favorable temperature distribution exists within the capsule. The vacuum environment may also ensure that light is able to travel at its maximum speed within the capsule, with the light being unhindered by molecular interference in the air or other gas that might otherwise be provided in the capsule; this likewise reduces or eliminates a significant source of excess heating. The use of a vacuum environment to prevent interference also improves the usability of light emitters that emit photons having a lower wavelength magnitude, ensuring that these photons better contribute to electron displacement within the crystalline lattices of the photovoltaic cells. (As discussed, in some exemplary embodiments, a vacuum may be any level of vacuum, such as a low vacuum, which may ensure that photons are relatively unobstructed while still allowing some level of convection to remove heat from the capsule.)

According to an exemplary embodiment, the light emitters may be any light emitter such as traditional lasers or LEDs. In another exemplary embodiment, the design may make use of integrated LED wafers, which may be directly grown using a direct crystalline adhesion method so as to provide the LEDs directly on the surface of the medium. For example, in an exemplary embodiment, a process such as epitaxial growth may be used in order to directly grow the LED crystals on the inner surface of the capsule, or on a wafer that may form a portion of the inner surface of the capsule, such as may be desired. (Epitaxial film growth is a process whereby one or more crystalline overlayers may be deposited onto a crystalline substrate by using the substrate as a seed crystal. The overlayer(s) may be called the "epitaxial film," and may be provided in a given orientation based on the configuration of the substrate crystal, which may lock the deposited film into one or more crystallographic orientations. Epitaxial film growth may be commonly used for production of LEDs and various types of epitaxial growth may be employed under different circumstances, as would be understood by a person of ordinary skill in the art.) In an exemplary embodiment, the integrated LED wafers may be distributed in the interior of the capsule based on the size of the lasing medium and the crystalline lattice structure, which may ensure that the pump sources are as efficiently used as possible.

According to one exemplary embodiment, it may be contemplated to integrate some or all of the other components with the integrated LED wafers, such that, in some exemplary embodiments, the components may all be provided on the integrated LED wafers. For example, according to an exemplary embodiment, an integrated LED wafer may be a structure (such as a rectangular structure with flat faces, which may in some exemplary embodiments be formed from any of a variety of materials) upon which the photovoltaic cells may first be attached or grown. (For example, according to an exemplary embodiment, a wafer may be a 500 mm by 300 mm by 3-5 mm structure, upon which, on the larger faces, photovoltaic cells may be attached or grown, using processes similar to the epitaxial growth process that may be used in order to provide the LEDs on the surface of the structure.) These wafers may be integrated with or disposed inside the capsule such that the reactive sides of the photovoltaic cells face the two larger polished faces of the capsule. The backing of each of the photovoltaic cells may be coated with a reflective coating, for example a dielectric or another type of reflective coating, such as may be desired, which may in some exemplary embodiments be specific to the wavelength of the light that is intended to be trapped in the lasing medium (such as the ruby or the NdYAG medium). The light that is not absorbed by the photovoltaic cells may thus be redirected into the lasing medium for amplification and reuse within the process of stimulated emission.

According to an exemplary embodiment where the photovoltaic cells are provided, along with the optical amplification medium, as part of a multi-layered design, an arbitrary number of layers may be provided, such as may be desired. For example, two or more than two photoelectric layers may be provided, two or more than two reflective layers may be provided, and one or more than one optical amplification medium layer may be provided. In some exemplary embodiments, the overall pattern of structures such as may be used in a first exemplary embodiment—reflective coating, photovoltaic cells, lasing optical amplification medium, photovoltaic cells, reflective coating—may be repeated one or more times in order to provide a multi-layered design. (This may, in some exemplary embodiments, require only several millimeters of additional thickness.) Alternatively, in some exemplary embodiments, the layers may be placed out of order, or only a subset of layers may be repeated; for example, it may be contemplated to have a multi-layer design in which the layers are disposed in this order: reflecting medium, photovoltaic cells, optical amplification medium, reflecting medium, photovoltaic cells, optical amplification medium, reflecting medium (with the reflecting medium being used to reflect photons back through the optical amplification medium and into the photovoltaic cells). Other variants may also be contemplated and may be used as desired.

According to an exemplary embodiment, the storage functionality of one exemplary embodiment the device may be explained as follows. (It is noted that, in other exemplary embodiments, different components or different arrangements of components may be understood.) Photovoltaic cells may be used having a quantum efficiency of 97% at a given wavelength band, in particular 694.3 nm-700 nm. The photonic energy storage device may further be provided with one or more LEDs having a radiant intensity of 2900 mW. In the exemplary embodiment, this LED may run at 3.3 V and 350 mA, requiring 1.155 W of power. It may therefore be understood that, at certain conditions, the radiant intensity produced by the 694.3 nm-700 nm LED may exceed the wattage required to run it when pulsed at certain frequencies. (Under these conditions, the remainder of the emitted power may be drawn from heat provided across a favorable temperature gradient, similar to the function of a thermocouple.)

When the LED contemplated in the present design is directed directly at a photovoltaic cell, the cell may produce 0.7 W of power. However, when the LED is installed within the capsule of the photonic energy storage device, essentially all light produced by the LED may be directed toward the photovoltaic cell, producing 2.15 W of power. As presently arranged, the device may produce excess power of approximately 0.995 W under typical initial conditions (based on the use of heat provided across a favorable temperature gradient as described above), which may degrade over time as the photonic energy storage device heats up and experiences some losses due to electronic resistance. (However, even continuous long-term operation of the device may produce an excess of 0.5 W, so long as the thermal conditions to which the device is subject remain similar.)

According to other exemplary embodiments, various other arrangements of an LED, housing, and photoelectric cell may be contemplated. For example, it may be noted that, in previous studies, LEDs may be made over 200% efficient (based on the amount of optical power that they produced and the electrical power required to produce this optical power) so long as the input wattage is lowered to a sufficiently low value, and so long as the LED only produces a small amount of light energy such that atmospheric cooling keeps it efficient. As such, in an exemplary embodiment, a photonic energy storage device may be operated at a lower power level in order to take advantage of higher efficiencies, allowing the LEDs to operate at a 200% or greater efficiency value while allowing atmospheric cooling to maintain the favorable temperature gradient that allows for the continued operation of the LEDs at 200% or greater efficiency.

In various exemplary embodiments, it may be noted that the thermal equilibrium of the LED wafers with the lasing medium and environmental air placed into the lasing medium may determine the operating temperatures and frequencies at which the overall photonic energy storage device may be run. This may allow the efficiency values in excess of >100% to be reached. Under other circumstances, it may also be contemplated to have different surroundings other than air, which may be placed into contact with the lasing medium in order to maintain the photonic energy storage device at a desirable equilibrium temperature. (For example, an exemplary embodiment of the design may be immersed in water in order to maintain the capsule at a desired operating temperature.) It may also be contemplated to make use of one or more intervening media, other than environmental air or water, in order to maintain the capsule at a desired operating temperature; for example, in an exemplary embodiment, it may be desirable to conduct heat rapidly away from the surface of the capsule, and as such the capsule may be immersed in a thermally conductive fluid such as a silicone heat transfer fluid which may then be cooled by air.

It is likewise noted that, in some exemplary embodiments, different LED frequencies or different LED flash times may be used when the LEDs are operating at certain wattages or wavelengths. The frequency with which a given LED may be pulsed, or the flash time over which an LED may actually emit light over a pulsing process, may be adjusted specifically for a given LED or LED chip, allowing for losses to be minimized and non-beneficial heat levels to be reduced as much as possible. In some exemplary embodiments, it may be contemplated to use an array of two or more LEDs that may pulse at different frequencies (or the same frequencies), or may be contemplated to use an array of two or more LEDs that may pulse using different flash times (or the same flash times). Other variants may also be contemplated; for example, in some exemplary embodiments, it may be desirable to use an LED that operates over one part of a wavelength band absorbed by a photovoltaic cell as one part of an array, and another LED that operates over another part of a wavelength band absorbed by a photovoltaic cell as another part of an array, such that the LED array is producing photons having two or more wavelengths that may each be absorbed by the photovoltaic cells. (For example, in an exemplary embodiment, a first LED may be used with a peak close to 694.3 nm, and a second LED may be used with a peak close to 700 nm, each of which may be absorbed by a photovoltaic cell capable of absorbing light within this band.) In another exemplary embodiment, it may be desirable to use a photovoltaic cell that can absorb light in multiple wavelength bands; in such an exemplary embodiment, LEDs in an LED array may be selected such that a first LED is provided having a peak in a first wavelength band and such that a second LED is provided having a peak in a second wavelength band (with the option for successive LEDs and successive wavelength bands continuing after the second, if desired).

In an exemplary embodiment, the overall case design may include, outside of the capsule, a control board, such as a thin integrated circuit board which may be utilized in various configurations in order to control electrical variables that may be used in order to harvest energy. (As noted, the capsule may contain a vacuum environment, and all electrical circuitry such as the control board may be housed externally, in order to ensure that internal heat generation in the capsule is isolated in order to enhance electrical generation through the Peltier effect.) For example, the control board may be used in order to route excess energy from the capsule (in circumstances in which the capsule is able to produce excess energy from the temperature gradient to which it is subject) to a connected energy storage device, such as a connected bank of supercapacitors which may be used to support on and off functions of the device. (Alternatively, other energy storage devices may be used; for example, it may be contemplated to have a bank of photonic energy storage devices which may turn on one or more members of the bank based on the power supplied or demanded.) This may increase the lifespan of the device's parts, and may also allow for increased power consumption to be accommodated in the event that there is a sudden spike in power demand.

In various exemplary embodiments, various sizes of the photonic energy storage device may be contemplated. For example, according to an exemplary embodiment, it may be contemplated that a small bank of photonic energy storage devices may be employed in a cellular phone or other portable device, or that a larger bank of photonic energy storage devices may be employed in a larger electronic device such as a television. Various other sizes of a photonic energy storage device may be contemplated to exist, including even larger devices, if desired. (It may be contemplated that, according to existing manufacturing techniques, it may be increasingly difficult to create larger-diameter flat sheets of laser optical amplification medium, such as flat sheets of ruby. For example, while larger sheets exist and can be manufactured, existing producers may make use of a typical size of around 8 to 9 inches in diameter. In such exemplary embodiments, these sheets may be cut and fused, such as may be desired. Other techniques than those which may be in common use for laser optical amplification medium manufacturing may be capable of producing larger sheets, often at increased expense, and in some exemplary embodiments these techniques may be used instead. It may also be contemplated to arrange multiple photonic energy storage devices in parallel to one another in order to ensure that no one device relies on sheets that are unworkably large, such as may be desired.)

In some exemplary embodiments, it may be contemplated to use a photonic energy storage device in order to supply operational power to an electronic device; however, it may also be contemplated to use a photonic energy storage device in order to supply power to individual components of a device, or in order to manage a level of power that may be supplied to a device or an individual component of a device. For example, in some exemplary embodiments, a photonic energy storage device may be used in place of a capacitor circuit as a device for smoothing ripple or voltage variations that may be supplied by a given power source.

Turning now to exemplary FIG. 1, FIG. 1 displays an exemplary embodiment of one half of a photonic energy storage device enclosure 100, which may illustrate the various components of the photonic energy storage device. According to an exemplary embodiment, the photonic energy storage device enclosure 100 may have an outer enclosure 102 and an inner capsule 202 suspended within the outer enclosure 102, which may be, for example, with a structural support 110 provided on the inner wall of the outer enclosure 102 and linking the outer enclosure 102 to the capsule 202.

According to an exemplary embodiment, an outer enclosure 102 may be joined with one or more other outer enclosure components (such as another outer enclosure 102, the two halves together forming a whole). According to an exemplary embodiment, the outer enclosure 102 may be separated at a midpoint of the left and right outer enclosure walls 104, which may be joined by the bottom outer enclosure wall 106. (According to an exemplary embodiment, the inner capsule 202 may be connected to the bottom outer enclosure wall 106; alternatively, the structural support may be provided along the left or right outer enclosure wall 104, and may bend in an L-shape in order to connect to the underside of the capsule 202, which may serve to better thermally isolate the capsule 202 from its surrounding environment by isolating the capsule 202 from thermally conductive material such as the walls of the outer enclosure 202.)

According to an exemplary embodiment, an outer enclosure 102 may be designed to use atmospheric cooling or another form of gas cooling in order to maintain the capsule 202 at a desirable temperature in order to enable the LEDs of the capsule to better make use of the Peltier effect in order to achieve high efficiency values. In an exemplary embodiment, the outer enclosure 102 may include an atmospheric cooling or other gas cooling system, such as a slot for a fan to be disposed or other cooling system slot 108. In another exemplary embodiment, another cooling system may be used, such as a liquid cooling system, and as such a fan slot 108 may not exist or may be substituted for a slot or space for another type of cooling apparatus such as a pump for the liquid cooling system.

According to an exemplary embodiment, a fan slot 108 may be provided such that it has multiple pieces, or spaces of multiple pieces, on either side, which may act to induce air resistance and build air pressure in the internal part of the enclosure. (These pieces may also work to filter the input air, such as may be desired, ensuring that debris is not introduced into the enclosure.) This may allow lower-powered fans provided in the fan slot 108 to produce faster air currents by leveraging calculated resistance to the air input and resistance to the air output in order to increase the airflow that may be possible with a low-power fan. This may ensure that less power is drawn from the overall system in order to operate the fan provided in the fan or cooling system slot 108, increasing the efficiency of the overall system.

Looking next at the capsule 202, according to an exemplary embodiment, a capsule 202 may have an insulated design, with an outer wall 204, an intermediate gas or vacuum-filled portion 206, and an inner wall 208, which may (in use) feature the LEDs and photovoltaic panels used to store and/or generate power as contemplated in the above disclosure. According to an exemplary embodiment, a capsule 202 may have wafers featuring LEDs and photovoltaic panels featured at various points around the capsule 202, such as at the marked sites 210, 212, or elsewhere. In an exemplary embodiment, one or more of the LEDs may be disposed such that the LED spans the intermediate gas or vacuum-filled portion 206, allowing heat to be conducted through the LED to the external surroundings, such that a heat gradient is established. This may allow the LED to operate at a higher efficiency, as discussed previously, due essentially to the Peltier effect. (In an exemplary embodiment, a heatsink may be provided on the outside end of the LED in such a manner as to allow air to be conducted over the heatsink by the cooling system, in order to ensure that the LED wafer may be maintained at a desirable temperature.)

According to an exemplary embodiment, a capsule 202 may be significantly longer than it is wide, having a spherocylindrical shape with a cylindrical portion 214 and two hemispherical ends 216. According to an exemplary embodiment, any other shape may be used, if desired, such as a sphere shape or a conical cylinder shape. Likewise, the chamber that is defined in the outer enclosure 102 for the capsule 202 may be any shape; for example, in an exemplary embodiment, the chamber may be cylindrical and only one chamber wall 104, 106 may exist, which may form a half-cylinder and may be fused with another half-cylinder of another photonic energy storage device half-enclosure 100.

In some exemplary embodiments, the halves of a photonic energy storage device may not be equal in size or shape, or may otherwise not part at a parting line disposed at a halfway point on the photonic energy storage device. For example, according to an exemplary embodiment, a capsule 202 may be separable in a lengthwise direction rather than in a widthwise direction, such that the capsule may be fused around the perimeter of the cylinder 214 or the perimeter of one of the hemispherical ends 216. Likewise, it may be contemplated to have the capsule 202 be separately insertable into and connectable to the outer enclosure 102, rather than being fixedly coupled to the outer enclosure 102. Other components of the outer enclosure 102, such as a fan slot 108 or other cooling device retaining structure, may likewise be separate pieces, and in an exemplary embodiment the outer enclosure may be designed to separate longitudinally instead of transversely (as shown in FIG. 1).

Figure 2A:
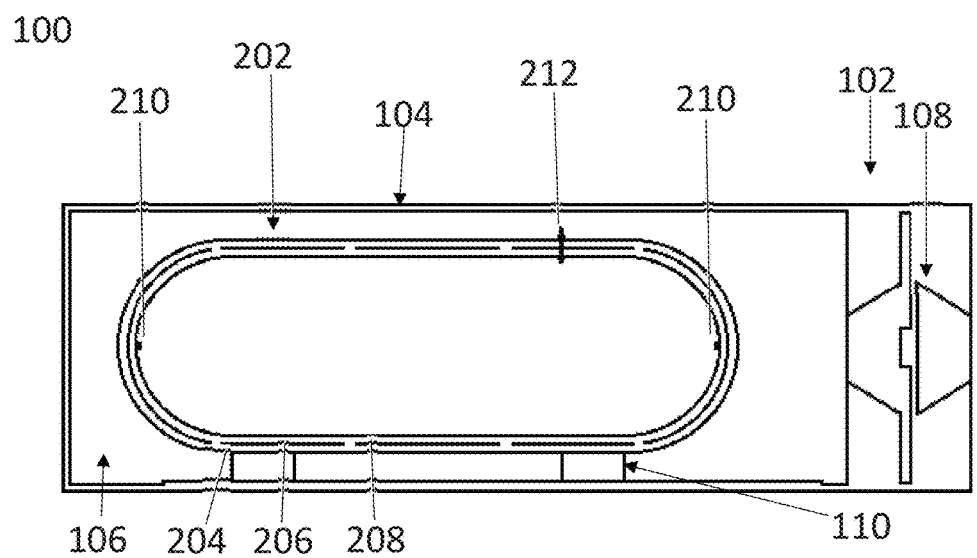
FIG. 2A is an exemplary embodiment of a photonic energy storage device half, shown from a top view.

Turning now to exemplary FIG. 2A, FIG. 2A may show an alternate view of a photonic energy storage device half-enclosure 100 such as is shown in FIG. 1. Specifically, a top view may be shown. According to an exemplary embodiment, a capsule 202 may be shown as suspended by structural supports 110 which may be provided at various points along the capsule 202. For example, in an exemplary embodiment, a capsule 202 may be provided with a front and back support 110. Alternatively, if desired, a support 110 may be continuous, spanning from a front position to a back position along some portion of the capsule 202.

Figure 2B:
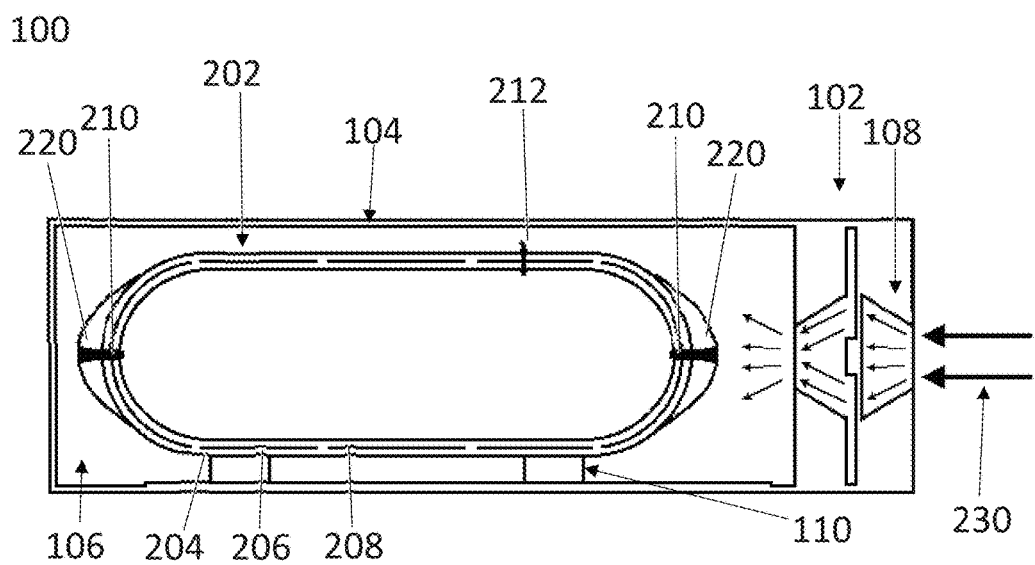
FIG. 2B is an exemplary embodiment of a photonic energy storage device half, shown from a top view, and showing a pathway of air that may be drawn by the cooling system.

Turning now to exemplary FIG. 2B, FIG. 2B may show an alternate view of a photonic energy storage device half-enclosure 100 which may in this case feature heatsinks 220. According to an exemplary embodiment, the LED wafers that may in this case be provided as light sources in the marked sites 210 (or any other light sources that may be desired) may be provided with thermal cooling materials, such as by conductive printed circuit boards (PCBs) coupled to the wafers, by copper or aluminum cooling components, by thermo-electric coolers (TECs), or by any other cooling material such as may be desired. This may allow heat to be removed from the capsule 202 without disrupting the internal environment of the capsule 202 or causing other components within the capsule 202 to diverge from their optimum operating temperatures. The fan or cooling system that may be provided in the fan slot 108 or elsewhere may then cool the capsule (including, specifically, the heat sinks connected to the LEDs or other light sources), for example by blowing outside air 230 on a path through the outer enclosure 102 such that it exits through the other end of the outer enclosure 102.

Figure 3:
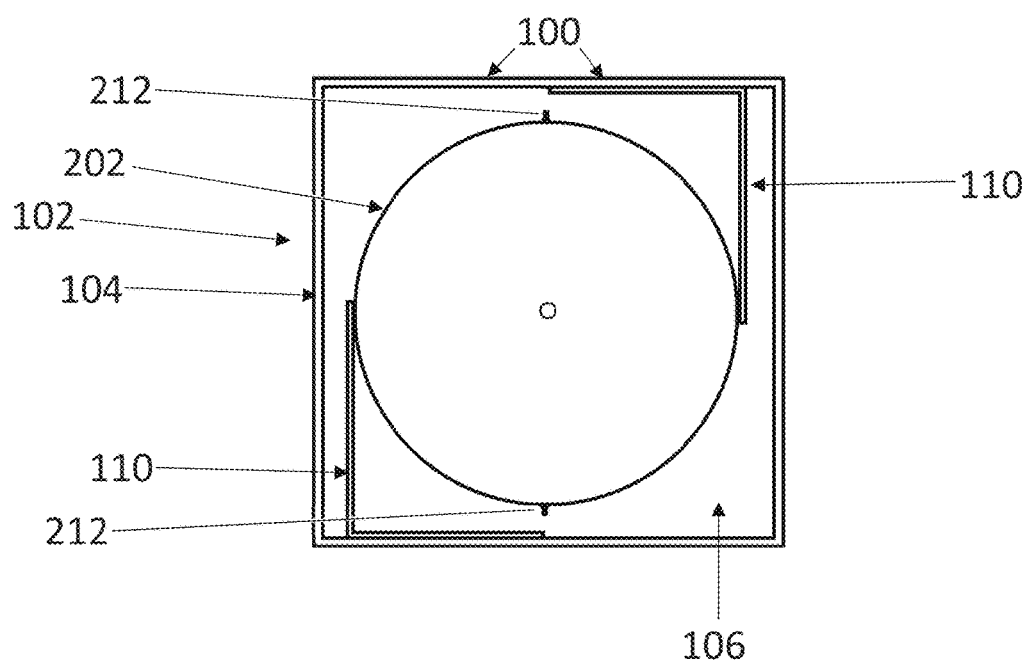
FIG. 3 is an exemplary embodiment of a photonic energy storage device, shown from an end view.

Turning now to exemplary FIG. 3, FIG. 3 may show an end view of an assembled photonic energy storage device, assembled from two photonic energy storage device half-enclosures 100. According to an exemplary embodiment, a capsule 202 may be suspended in the center portion of the photonic energy storage device, with each side of the capsule 202 being suspended by structural supports 110 provided on one of the photonic energy storage device half-enclosures 100. (According to an exemplary embodiment, each of the structural supports 110 may have an L-shape, such that, if the photonic energy storage device half-enclosures 100 are produced so as to be identical in shape, one of the photonic energy storage device half-enclosures 100 may be rotated 180 degrees from the other photonic energy storage device half-enclosure 100 such that one of the L-shapes is provided on one side of the photonic energy storage device and the other L-shape is provided on the other side of the photonic energy storage device, suspending the capsule 202 in the center.

Figure 4:
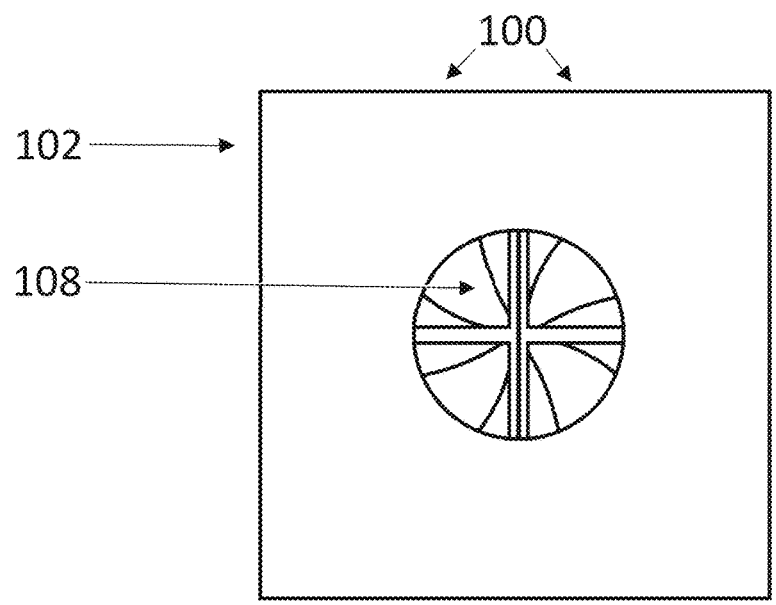
FIG. 4 is an exemplary embodiment of a photonic energy storage device, shown from an alternative end view.

Turning now to exemplary FIG. 4, FIG. 4 may show the opposite end view of an assembled photonic energy storage device, assembled from two photonic energy storage device half-enclosures 100. According to an exemplary embodiment, a fan slot 108 or other cooling device slot may be provided on one end of the photonic energy storage device, such that air (or another fluid) may be provided through the outer enclosure 102 and around the capsule. According to another exemplary embodiment, one or more fan slots 108 or other cooling systems may be provided elsewhere on the outer enclosure 102, if desired; for example, in an exemplary embodiment, a plurality of fan slots 108 may be provided on the end of the outer enclosure 102, while in another exemplary embodiment a plurality of fan slots 108 may be provided in a transverse direction from the capsule instead of in a longitudinal direction. As noted, according to an exemplary embodiment, a constriction or other geometric feature may be provided after the fan slot 108 in order to increase the air pressure that may be provided by the fan, allowing a lower-power fan to be used in order to conduct air at a particular velocity.

Figure 5:
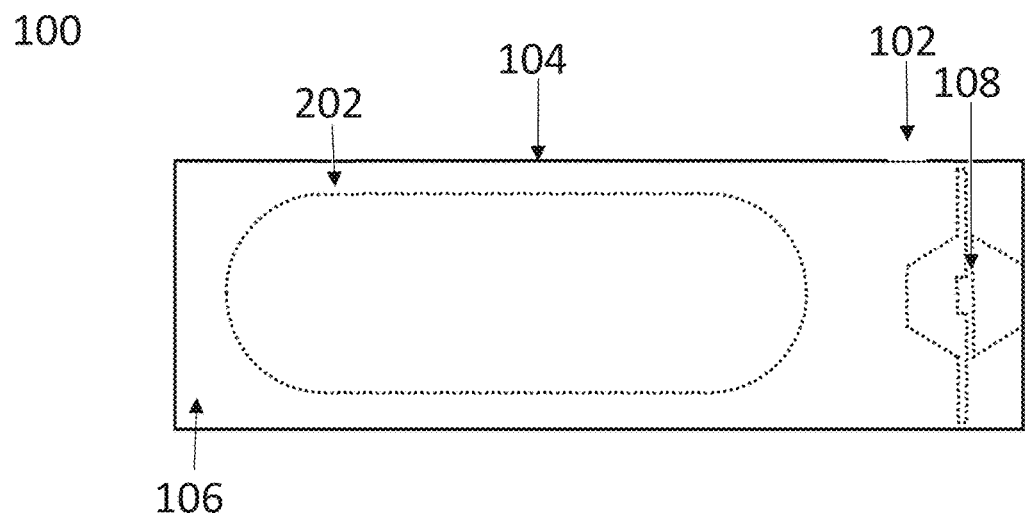
FIG. 5 is an exemplary embodiment of a photonic energy storage device half, shown from a top view.

Turning now to exemplary FIG. 5, FIG. 5 may show an exemplary embodiment of one half of a photonic energy storage device enclosure 100, as shown from the back. In an exemplary embodiment, the back side of the photonic energy storage device enclosure half 100 may be a smooth panel without exterior features. Alternatively, the walls 104, 106 of the outer enclosure 102 may have any features that may be desired, such as additional fan slots 108 or cooling fins, such as may be desired. The relative dispositions of the capsule 202 and the fan slot 108 may be shown in dotted lines in FIG. 5.

Figure 6:
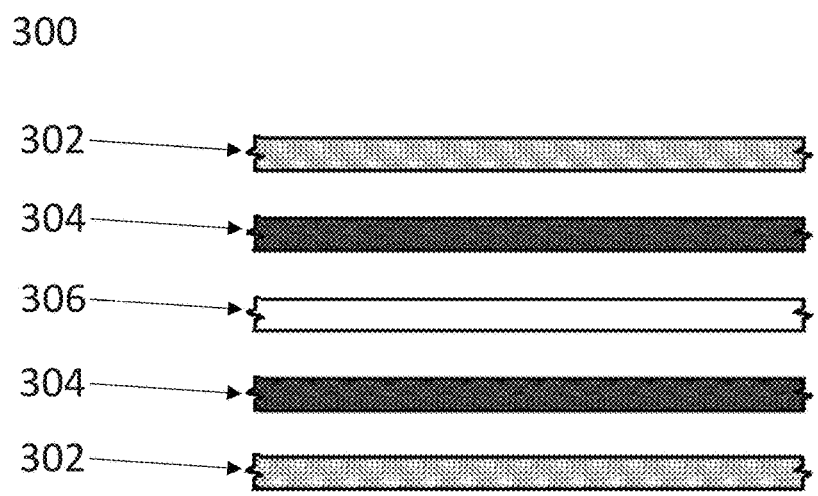
FIG. 6 is an exemplary embodiment of a photonic energy storage device capsule layer arrangement.

Turning now to exemplary FIG. 6, FIG. 6 may show an exemplary embodiment of a photonic energy storage device capsule layer arrangement 300. According to an exemplary embodiment, a flat sheet LED wafer may be provided with reflective material 302 on each outside face, and a photovoltaic panel 304 may be provided inwards from each set of reflective material 302. In the center may be a laser optical amplification medium 306, such as ruby or another such medium as may be desired.

Figure 7:
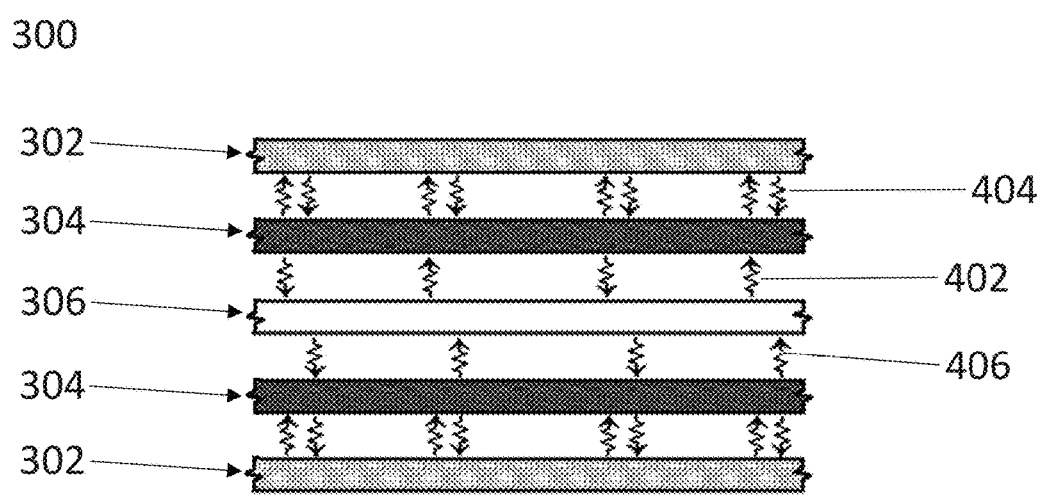
FIG. 7 is an exemplary embodiment of a photonic energy storage device capsule layer arrangement.

Turning now to exemplary FIG. 7, FIG. 7 may show an exemplary embodiment of a photonic energy storage device capsule layer arrangement 300, in this case showing the production and absorption of photons within the photonic energy storage device capsule layer arrangement 300. According to an exemplary embodiment, just as in FIG. 6, a flat sheet LED wafer may be provided with reflective material 302 on each outside face, and a photovoltaic panel 304 may be provided inwards from each set of reflective material 302. In the center may be a laser optical amplification medium 306, such as ruby or another such medium as may be desired, into which the flat sheet LED wafer may be disposed. According to an exemplary embodiment, the flat sheet LED wafer disposed in the laser optical amplification medium 306 may produce a number of photons 402, which may generally be directed at the photovoltaic panels 304. Some of the photons 402 may pass into and be absorbed by the photovoltaic panels 304, while other photons 402 may pass through the photovoltaic panels 304, at which point they may be reflected 404. In some cases, photons 404 may be absorbed by the photovoltaic panels 304 after being reflected; alternatively, they may be directed back into the optical amplification layer 306 after passing through the photovoltaic panels 304 again. These photons 406 may then be conducted within the optical amplification layer and may pass into another photovoltaic panel 304, such as may be desired.

Figure 8:
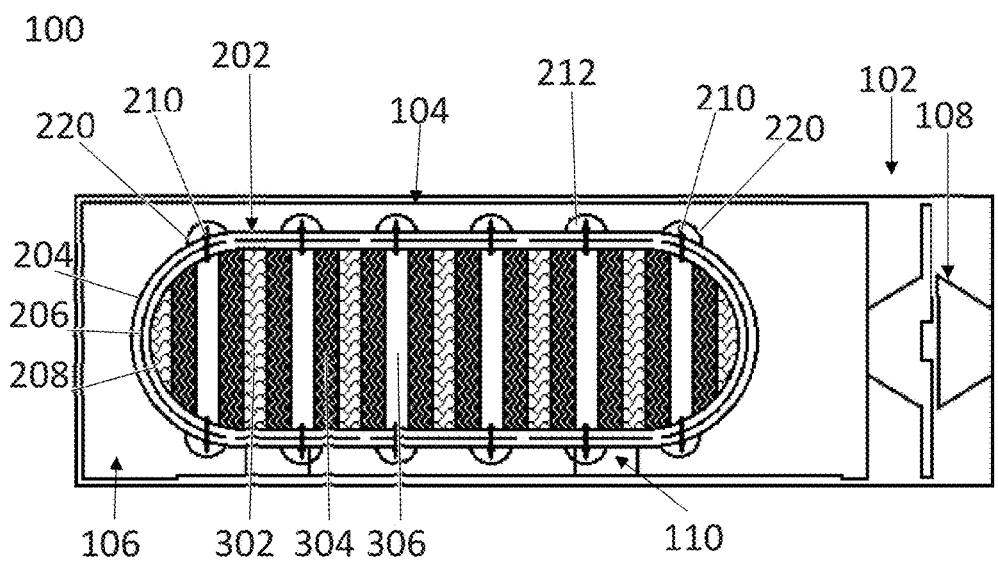
FIG. 8 is an exemplary embodiment of a photonic energy storage device provided together with a capsule layer arrangement.

Turning now to exemplary FIG. 8, FIG. 8 may show an exemplary embodiment of a photonic energy storage device half-enclosure 100 provided together with a capsule layer arrangement such as is shown in FIG. 6. According to an exemplary embodiment, the capsule 202 may have the capsule layer arrangement formed throughout the extent of the capsule 202, such that the overall capsule 202 has many different layers in different arrays. (In some exemplary embodiments, the exact disposition of the different layers or arrays may depend on the application in which the capsule is to be employed.) In an exemplary embodiment, the capsule layer arrangement may be provided with layers disposed from one end to the other end of the capsule 202. A pattern may be formed in the layers such that an optical amplification layer 306 is sandwiched in between two photovoltaic layers 304, which in turn are sandwiched between two reflective layers 302. In other exemplary embodiments, other variations may be contemplated; for example, it may in some circumstances be preferable to have only one photovoltaic layer 304 per optical amplification layer 302, and as such this may be disposed on one side of the optical amplification layer 302, such as may be desired.

In some exemplary embodiments, wherein the layers are disposed in a capsule 202 from one end to the other end, the capsule 202 may have a variety of shapes, and may, for example, not be capsule-shaped. For example, according to an exemplary embodiment, a capsule 202 may have spherical ends, but in another exemplary embodiment a capsule 202 may have conical ends, flat ends, or any other shape such as may be desired. It may also be contemplated to have a capsule 202 that does not have a straight cylindrical body between the ends, if desired; for example, it may be desired to have an uneven surface with cooling fins or other such structures protruding from the surface in order to enhance the effect of convection and thereby enhance the effect of the cooling system.

In an exemplary embodiment, the heat sinks 220 that are coupled to the LEDs and which pass through the vacuum barrier of the capsule 202 may have any shape or size. In some exemplary embodiments, the heat sinks 220 may be provided as single pieces, such that a single heat sink serves a large number of LEDs and extends over a significant length of the capsule. In some other exemplary embodiments, heat sinks 220 may each be a single piece connected to just one LED wafer. In other exemplary embodiments, a mix of the two may be used. The LEDs may be connected to the heat sinks 220 in such a manner as to allow the LEDs to readily pump the optical amplification medium 306.

Figure 9:
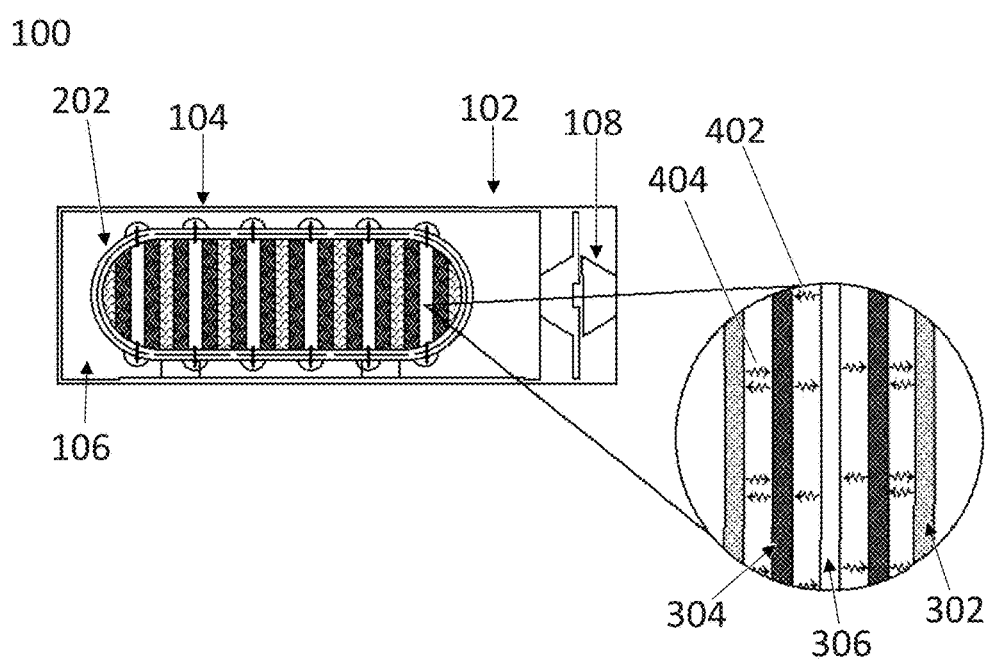
FIG. 9 is an exemplary embodiment of a photonic energy storage device provided together with a capsule layer arrangement.

Turning now to exemplary FIG. 9, FIG. 9 may show an exemplary embodiment of a photonic energy storage device half-enclosure 100 provided together with a capsule layer arrangement such as is shown in FIG. 6 and FIG. 7, in this case showing the photons that may be provided within the photonic energy storage device 100. According to an exemplary embodiment, the capsule 202 may have the capsule layer arrangement formed anywhere within it, or at a specific point within the capsule 202 such as the center of the capsule 202. Light may be emitted from LED wafers integrated with the optical amplification medium 306. (Alternatively, in some exemplary embodiments, light may be emitted from elsewhere in the capsule 202, such as from light sources such as LEDs configured to direct light into the optical amplification medium 306 but which are not fully integrated with it.) In such an exemplary embodiment, when photons 402 are emitted and directed at the photovoltaic panels 304, some of the photons 402 may pass through the photovoltaic panels 304 and be reflected by the reflective layer 302, which may cause the reflected photons 404 to be directed back in the direction of the photovoltaic panels 304.

Figure 10:
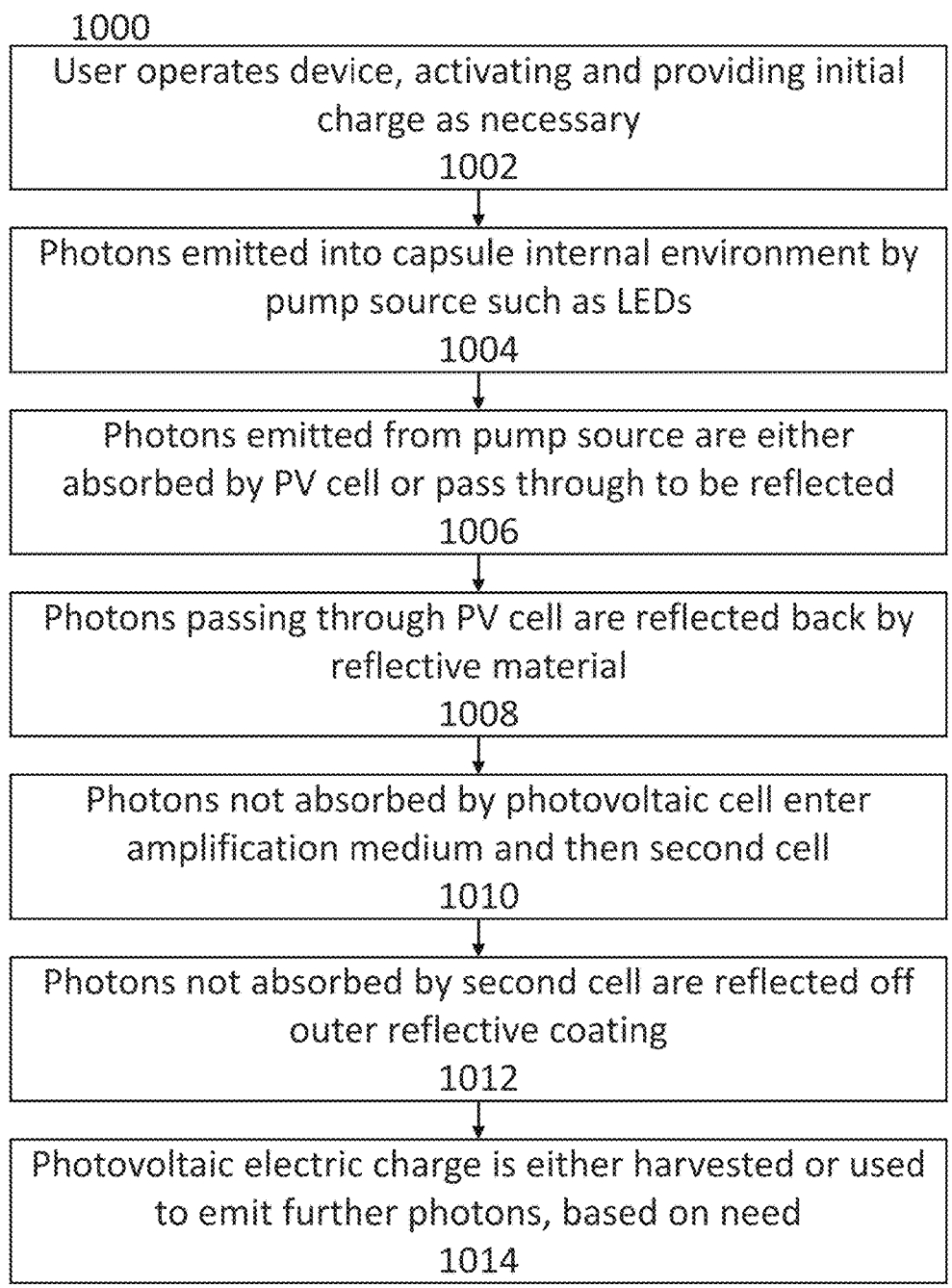
FIG. 10 is a flowchart describing an exemplary embodiment of a method for using a photonic energy storage device.

Turning now to exemplary FIG. 10, FIG. 10 may show an exemplary flowchart describing an exemplary embodiment of a method for using a photonic energy storage device 1000. According to an exemplary embodiment, in a first step, a user may activate the device, after the device has been provided with an initial charge in order to allow the device to store photons within the capsule environment 1002. (For example, in an exemplary embodiment, a user may fully charge the device with the expectation of losses over time, or may partially charge the device in a circumstance where the thermal environment in which the device is placed can be expected to provide partial charging.) In a next step, photons may be emitted into the capsule internal environment by a pump source, such as LEDs, which may allow those photons to be reflected or absorbed as appropriate 1004. In some exemplary embodiments, this pump source or these pump sources may be provided directly within an optical amplification layer, which may ensure that when the photons are emitted, they are emitted directly into a photovoltaic layer 1006, allowing for immediate harvesting of the photons; in exemplary embodiments where the LEDs are operating at a higher than 100% efficiency due to the thermal environment in which they exist, this may cause the photovoltaics to yield net production of power. In other exemplary embodiments, photons may be emitted into the capsule such that they eventually reach a reflective layer. Once the photons reach the reflective layer on an opposite wall, they may be reflected by the reflective layer 1008, and from there, back into the first photovoltaic layer.

Some of the photons reflected by the reflective layer may not be absorbed by the first photovoltaic layer, either, and may enter the optical amplification medium that may be provided directly after the first photovoltaic layer. While in the optical amplification medium, they may be distributed around the capsule such as may be desired, at which point the photons may enter the second photovoltaic cell 1010. Photons not absorbed by the second cell may be reflected off of the outer reflective coating, and so forth 1012.

(Different arrangements may be contemplated in certain other exemplary embodiments. For example, there may be a different arrangement of the layers such that only one photovoltaic cell is provided, which may be on one side of the optical amplification medium.)

The operator of this device may then be able to harvest some or all of the power from the device such as is necessary. Photovoltaic electric charge that is produced by the photons being absorbed by the photovoltaic layer may be used to re-emit photons from the capsule LEDs to which the photovoltaic layers may be connected, or may be siphoned off in order to power some other device 1014. This may be done based on need, as controlled by the control board that may be provided external to the capsule.

Figure 11:
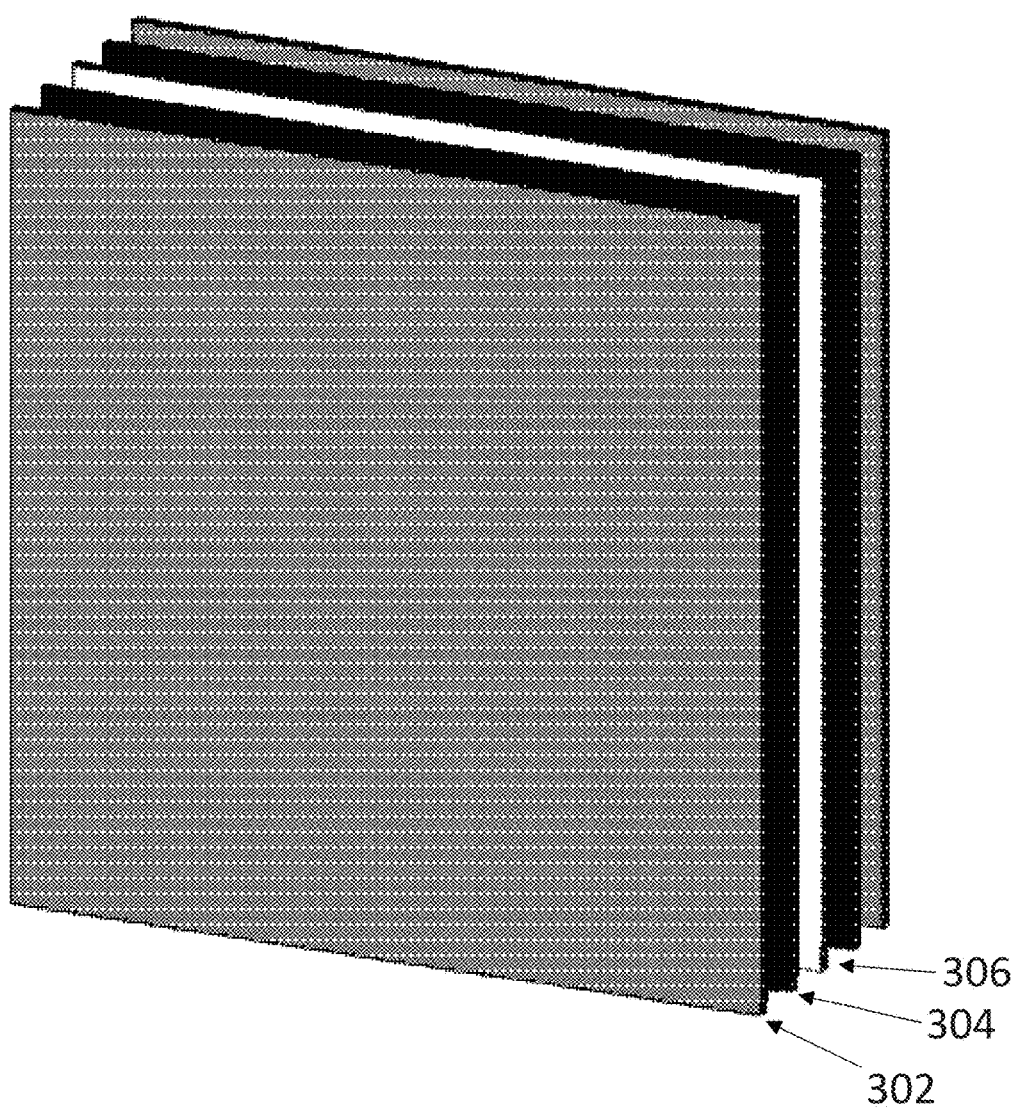
FIG. 11 is an exemplary embodiment of a photonic energy storage device configured as a "power sheet."

Turning now to exemplary FIG. 11, FIG. 11 displays an exemplary embodiment of a photonic energy storage device configured as a "power sheet" 1100, whereby the "power sheet" 1100 has an optical amplification layer with integrated LED wafers 306, at least one photovoltaic cell 304, and a reflective coating 302 provided on at least one side. Such a "power sheet" 1100 may be used to provide a flat, low-profile power storage system, which may be used to power certain low-powered electronics, such as display devices. This may allow the resulting display device to be very thin, so long as it generally has a low power consumption when the device is away from a charging location so that a smaller number of layers can be used for energy storage. For example, this may allow for the use of display devices for certain applications like smart ID cards that selectively display some information, "smart paper" flexible screens provided with a flexible photonic energy storage device backing, and so forth. Alternatively, a higher number of layers can be added in order to increase energy storage. In other cases, "power sheets" 1100 may be used for other applications even when a particularly thin energy storage solution is not necessary.

For example, in one exemplary embodiment, a cell phone may have various "power sheets" 1100 or "power layers" which may be provided along with a battery and/or a supercapacitor, with these "power sheets" 1100 being provided on the back of the cell phone body and routed to the internal battery or supercapacitor inside the phone. (In various embodiments, such sheets may be used in a variety of basic low-powered electronics, from small "smart devices" up to televisions.)

Figure 12:
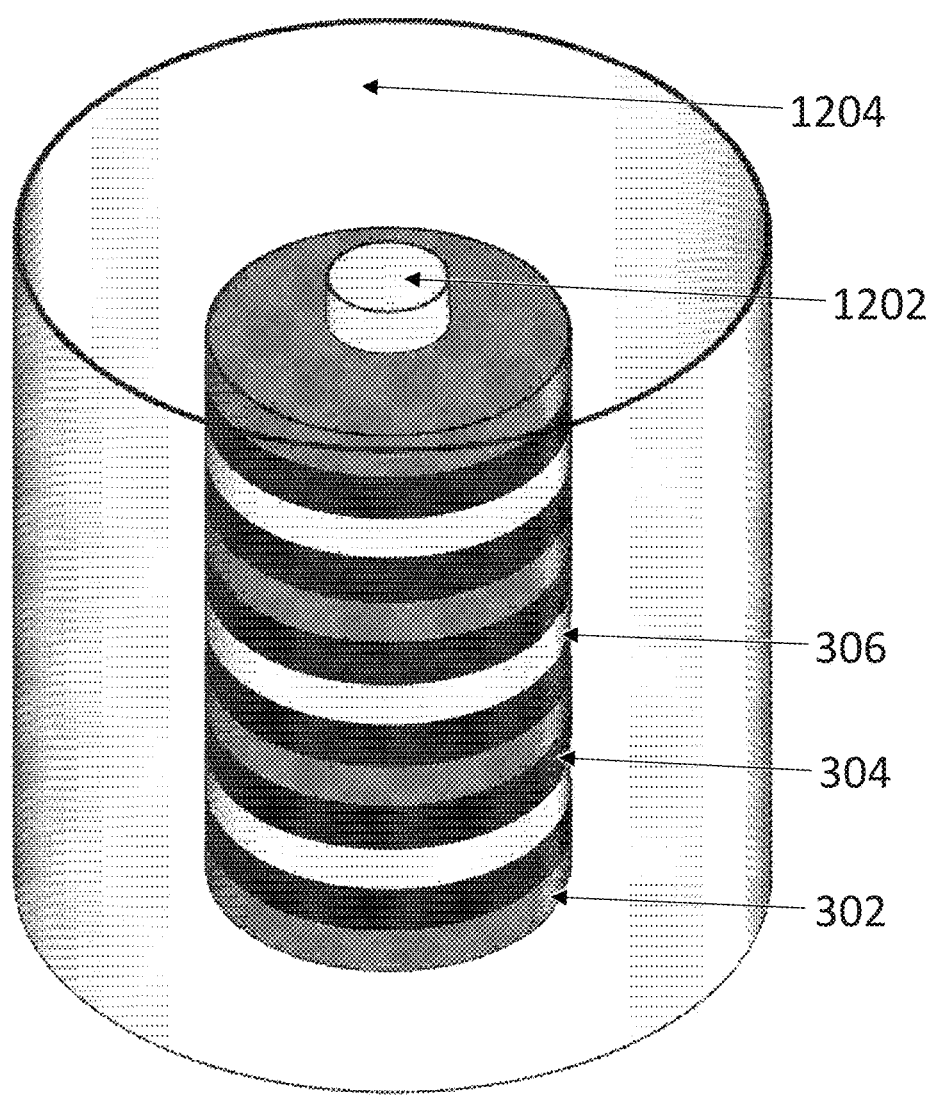
FIG. 12 is an exemplary embodiment of a photonic energy storage device configured as an energy storage device for a vehicle or other large power consumer.

Turning now to exemplary FIG. 12, FIG. 12 depicts an exemplary embodiment of a photonic energy storage device 1200 configured as an energy storage device for a vehicle or another device that consumes a more substantial amount of power than a low-powered electronic device such as has been previously discussed.

For example, according to an exemplary embodiment, a photonic energy storage system 1200 for a vehicle or other such device may have a clear cylindrical vacuum chamber 1204 with a number of layered cores 302, 304, 306 corresponding to the layers provided in the capsule design or in other exemplary embodiments. In some exemplary embodiments, layers may be of any thickness, such that hundreds or even thousands of layers may be contemplated to be present. (It may be contemplated that these layers may be much thinner than the layers depicted in FIG. 12, and that, in FIG. 12, these layers are not to scale, having been made much thicker to enhance visibility.)

For example, in an exemplary embodiment, a reflective coating 302 may be atomically structured in order to reflect most of the utilized monochromatic light of the pump sources over the applicable bandgap, which may reflect light into a slightly thicker high-absorption-efficiency photovoltaic cell. A lasing medium 306 may also be provided, which may in some exemplary embodiments have an LED wafer integrated into the lasing medium layers 306. (In an exemplary embodiment, the emissions of an LED wafer provided in the lasing medium or optical amplification layers 3306 may be controlled to flash at a particular frequency, based on a particular algorithmic sequence that may be predetermined to assist in maintaining thermal equilibrium and utilizing the lasing medium's luminescence properties.) This lasing medium 306 may be, for example, any medium such as ruby or any crystalline structure capable of solid state optical amplification and capable of inducing stimulated emission, and may be provided in thin layers that may have a thickness similar to that of the high-absorption-efficiency photovoltaic cell layers 304.

In the center of the layered cores 302, 304, 306 may be provided a hole, which may function as a storage location for a supercapacitor 1202, which may be run through the core in order to store harvested energy. This supercapacitor 1202 may also be used for routing the harvested energy from the layered cores and to some other device, such as may be desired.

Such a system as is contemplated in FIG. 12 may be used in an electric vehicle, for example as a power storage unit that can easily be swapped in and out of the vehicle and which does not suffer from degradation at the same rate that the vehicle's battery might suffer from degradation. However, various other uses may be contemplated for such a system, other than as a quickly and easily replaceable component of an electric car. For example, it may be contemplated that in many cases, certain battery technologies (such as lithium-ion) may pose unacceptable hazards, such as a risk of explosion or fire, which it may be desirable to mitigate. The exemplary embodiment depicted in FIG. 12 may offer a less reactive power storage solution that does not present such risks.

The foregoing description and accompanying figures illustrate the principles, preferred embodiments and modes of operation of the invention. However, the invention should not be construed as being limited to the particular embodiments discussed above. Additional variations of the embodiments discussed above will be appreciated by those skilled in the art (for example, features associated with certain configurations of the invention may instead be associated with any other configurations of the invention, as desired). For example, the integration of LED wafers into laser optical amplification mediums as contemplated by the present application may itself represent an exemplary embodiment of the invention, as this may represent a more efficient pumping method than traditional external pumping sources, which may act to decrease losses and increase amplification performance.

Therefore, the above-described embodiments should be regarded as illustrative rather than restrictive. Accordingly, it should be appreciated that variations to those embodiments can be made by those skilled in the art without departing from the scope of the invention as defined by the following claims.

What is claimed is:

1. A photonic energy storage capsule, comprising:
   a capsule body, the capsule body surrounding a sealed vacuum environment in which is provided a set of at least five thin layers of reactive material, the set of layers comprising:
   an inner reflective coating;
   a first photovoltaic layer provided outwards from the inner reflective coating;
   an optical amplification layer provided outwards from the first photovoltaic layer;
   a second photovoltaic layer provided outwards from the optical amplification layer; and
   an outer reflective coating provided outwards from the second photovoltaic layer;
   the photonic energy storage capsule further comprising at least one integrated LED wafer comprising one or more LEDs, and configured to direct light emitted by the one or more LEDs of the integrated LED wafer against the inner reflective coating.

2. The photonic energy storage capsule of claim 1, wherein each of the thin layers of reactive material has a thickness less than or equal to 80 microns.

3. The photonic energy storage capsule of claim 1, wherein the photonic energy storage capsule further comprises a control board housed externally to the capsule body and connected to the at least one integrated LED wafer, the first photovoltaic layer, and the second photovoltaic layer.

4. The photonic energy storage capsule of claim 1, wherein the capsule body has a reflective inner surface disposed outwards from the internal wall.

5. The photonic energy storage capsule of claim 4, wherein the reflective inner surface of the capsule body comprises polished aluminum.

6. The photonic energy storage capsule of claim 1, wherein the optical amplification medium comprises at least one of ruby, emerald, or neodymium-doped yttrium aluminum garnet.

7. The photonic energy storage capsule of claim 1, wherein the one or more LEDs of the LED wafer have a wavelength emission peak within the range of 694.3 nm to 700 nm.

8. The photonic energy storage capsule of claim 1, wherein the first photovoltaic layer and the second photovoltaic layer each comprise at least one layer of multi-junction gallium arsenide photovoltaic cells.

9. A photonic energy storage device, comprising:
a photonic energy storage capsule comprising a capsule body, the capsule body surrounding a sealed vacuum environment in which is provided a set of at least five thin layers of reactive material, the set of layers comprising:
an inner reflective coating;
a first photovoltaic layer provided outwards from the inner reflective coating;
an optical amplification layer provided outwards from the first photovoltaic layer;
a second photovoltaic layer provided outwards from the optical amplification layer; and
an outer reflective coating provided outwards from the second photovoltaic layer;
the photonic energy storage capsule further comprising at least one integrated LED wafer comprising one or more LEDs, and configured to direct light emitted by the one or more LEDs of the integrated LED wafer against the inner reflective coating; and
an enclosure, the enclosure comprising one or more walls configured to surround the photonic energy storage capsule, further comprising one or more supports disposed between the one or more walls of the enclosure and the photonic energy storage capsule, and at least one cooling unit configured to cool an internal environment of the enclosure between the one or more walls of the enclosure and the photonic energy storage capsule.

10. The photonic energy storage device of claim 9, wherein each of the thin layers of reactive material has a thickness less than or equal to 80 microns.

11. The photonic energy storage device of claim 9, wherein the photonic energy storage capsule further comprises a control board housed externally to the capsule body and connected to the at least one integrated LED wafer, the first photovoltaic layer, and the second photovoltaic layer.

12. The photonic energy storage device of claim 11, wherein the photonic energy storage device further comprises at least one supercapacitor electrically connected to the at least one control board, and wherein the at least one control board is configured to supply power between the supercapacitor and the at least one integrated LED wafer, the first photovoltaic layer, and the second photovoltaic layer based on an on-off state of the photonic energy storage device.

13. The photonic energy storage device of claim 9, wherein the capsule body has a reflective inner surface disposed outwards from the internal wall.

14. The photonic energy storage device of claim 13, wherein the reflective inner surface of the capsule body comprises polished aluminum.

15. The photonic energy storage device of claim 9, wherein the optical amplification medium comprises at least one of ruby, emerald, or neodymium-doped yttrium aluminum garnet.

16. The photonic energy storage device of claim 9, wherein the one or more LEDs of the LED wafer have a wavelength emission peak within the range of 694.3 nm to 700 nm.

17. The photonic energy storage device of claim 9, wherein the first photovoltaic layer and the second photovoltaic layer each comprise at least one layer of multi-junction gallium arsenide photovoltaic cells.

18. The photonic energy storage device of claim 9, wherein the cooling unit comprises a fan embedded in one face of the photonic energy storage device.

19. The photonic energy storage device of claim 9, wherein the photonic energy storage device comprises two halves separated by a parting plane, each of the halves comprising a capsule body half, an enclosure half, and a support in the one or more supports, the support connected at one end to the capsule body half and connected at another end to the enclosure half; and
wherein an upper surface of each capsule body half and an upper surface of each enclosure half are aligned along the parting plane, such that the upper surface of a first capsule body half is sealably connected to the upper surface of a second capsule body half such that the capsule body is vacuum-sealed, and such that the upper surface of a first enclosure half is connected to the upper surface of a second enclosure half.

20. A method of using a photonic energy storage capsule, the photonic energy storage capsule comprising:
a capsule body, the capsule body surrounding a sealed vacuum environment and comprising at least one integrated LED wafer and at least one set of at least five thin layers of reactive material, the set of layers comprising:
an inner reflective coating;
a first photovoltaic layer provided outwards from the inner reflective coating;
an optical amplification layer provided outwards from the first photovoltaic layer;
a second photovoltaic layer provided outwards from the optical amplification layer; and
an outer reflective coating provided outwards from the second photovoltaic layer;
wherein the method comprises:
activating the device;
emitting photons from the integrated LED wafer in the direction of the inner reflective coating, such that a first portion of the photons are reflected by the inner reflective coating in the direction of an inner wall of the capsule body, a second portion of the photons are absorbed by the first photovoltaic layer, and a third portion of the photons are received in the optical amplification layer; and
harvesting electrical power from at least the first photovoltaic layer using a control board connected to the first photovoltaic layer, the second photovoltaic layer, and the integrated LED wafer.

\* \* \* \* \*